United States Patent [19]

Maejima et al.

[11] Patent Number: 5,230,747
[45] Date of Patent: Jul. 27, 1993

[54] WAFER HAVING CHAMFERED BEND PORTIONS IN THE JOINT REGIONS BETWEEN THE CONTOUR OF THE WAFER AND THE CUT-AWAY PORTION OF THE WAFER

[75] Inventors: Hisashi Maejima, Higashiyamato; Hiroshi Nishizuka, Higashikurume; Susumu Komoriya, Tokorozawa; Etuo Egashira, Yamanashi, all of Japan

[73] Assignee: Hitachi, Ltd., Chiyoda, Japan

[21] Appl. No.: 783,920

[22] Filed: Oct. 29, 1991

Related U.S. Application Data

[60] Continuation of Ser. No. 240,806, Sep. 7, 1988, abandoned, which is a division of Ser. No. 830,754, Feb. 19, 1986, Pat. No. 4,783,225, which is a continuation of Ser. No. 741,107, Jun. 4, 1985, abandoned, which is a continuation of Ser. No. 517,405, Jul. 26, 1983, abandoned.

[30] Foreign Application Priority Data

Jul. 30, 1982 [JP] Japan ................. 57-131949

[51] Int. Cl.$^5$ ............................................. H01L 29/30
[52] U.S. Cl. .................... 148/33.2; 437/225; 437/249
[58] Field of Search ............ 437/249, 225; 148/33, 148/33.2, 33.3; 357/55; 51/283 E, 283 K, 281 SF

[56] References Cited

U.S. PATENT DOCUMENTS 3,951,728  4/1976  Egashira et al. .
4,228,937 10/1980  Tocci .
4,256,229  3/1981  Lee .
4,344,260  8/1982  Ogiwara .
4,488,930 12/1984  Koe .
4,630,093 12/1986  Yamaguchi et al. ............... 437/249
4,783,225 11/1988  Maejima et al. .................... 437/249

FOREIGN PATENT DOCUMENTS 0060567  5/1977  Japan .
5338594 10/1978  Japan .
0072034  5/1980  Japan ............................... 437/225
0105638  8/1981  Japan .
0043410  3/1982  Japan .
58-23430  2/1983  Japan .
0196512  8/1986  Japan ............................... 437/225
 922150  3/1963  United Kingdom .
 975960 11/1964  United Kingdom .

OTHER PUBLICATIONS

IBM Technical Disclosure Bulletin, vol. 22, No. 3 (Aug. 1979), "Diagnostic Method for Locating the Wafer Position in a Crystal".
IBM Technical Disclosure Bulletin, vol. 11, No. 12, (May 1969), "Duffusion Boat".
Semiconductor Silicon Manufacturing and Machining Using Diamond Tools–G. Janus, Burghausen, IDR13 Nr. 3, pp. 234–242 (1979).
Silicon Wafers with Optimum Edge Rounding, Solid State Technology, pp. 16–17, May 1976.
Solid State Technology, May 1976, vol. 19, Magazine 5, pp. 37–42.
Industrie Diamanten Rundschau, IDR 13 (1979), No. 3, pp. 234–242 (in German).

Primary Examiner—Olik Chaudhuri
Assistant Examiner—Long Pham
Attorney, Agent, or Firm—Antonelli, Terry, Stout & Kraus

[57] ABSTRACT

A wafer having chamfered bent portions in the joint regions between the contour of the wafer and the cutaway portion of the wafer such as an orientation flatness. The chipping of the wafer can be prevented, and in coating the wafer with a photoresist, forming an epitaxially grown layer on the wafer, etc., films having desired characteristics can be provided on the surface of the wafer.

3 Claims, 9 Drawing Sheets

FIG. 17 ns between the flat portion as the orientation
WAFER HAVING CHAMFERED BEND PORTIONS IN THE JOINT REGIONS BETWEEN THE CONTOUR OF THE WAFER AND THE CUT-AWAY PORTION OF THE WAFER This is a continuation application of application Ser. No. 07/240,806 filed Sep. 7, 1988 and now abandoned which, in turn, is a divisional application of application Ser. No. 830,754 filed Feb. 19, 1986, now U.S. Pat. No. 4,783,225 issued Nov. 8, 1988, which, in turn, is a continuation application of application Ser. No. 741,107 filed Jun. 4, 1985, now abandoned, which, in turn, is a continuation application of application Ser. No. 517,405 filed Jul. 26, 1983, now abandoned.

BACKGROUND OF THE INVENTION

The present invention relates to a wafer and a method of working the same and, more particularly, to a novel wafer and method of working the same which can prevent defects such as the chipping of the joint regions between the contour of the wafer and the cut-away portion of the wafer such as an orientation flatness.

In general, in the production of a semiconductor device such as a transistor, an integrated circuit (IC) or a large-scale integrated circuit (LSI), when foreign matter including dust, chipping etc. adhere on the surface of a wafer, which is a substantially circular flat member made of a semiconductor material such as silicon (Si), when subjecting the wafer to processing such as diffusion, coating with a resist, etching and evaporation, the foreign matter causes scratches in the wafer surface and defects such as an nonuniform film thickness and drawbacks arise during transportation of the semiconductor device.

There are various causes for the appearance of such foreign matter. As one of the causes, it has been known that, for example, during the transportation of wafers the outer peripheral part of the wafer collides against any transport mechanism or the wafers come into contact with each other, whereby the outer peripheral part of the wafer itself breaks off locally. Chips resulting from the breakage adhere on the surface of the wafer as the foreign matter, to incur various defects. In order to prevent the aforementioned breakage of the outer peripheral part of the wafer, in, for example, Japanese Patent Application Publication No. 53-38594, both the major surfaces of the wafer outer-peripheral part have been chamfered by mechanical or chemical means.

However, it has been have found that, even when both the major surfaces of the wafer outer-peripheral part are chamfered in this manner, the wafer nevertheless frequently chips.

As a result of research efforts into the cause of chipping, important facts have been revealed. In general, a wafer is formed with a flat portion called the "orientation flatness (principal flatness)" by cutting a part of the wafer rectilinearly, in order to indicate the crystal orientation of the wafer and also to position the wafer. The formation of such flat portion, however, results in forming acute bends in the joint parts between the flat portion and the contour of the wafer. Consequently, the joint part is liable to chipping. That is, during the transportation of the wafer, the joint part collides against the guide of an air bearing or comes into touch with another wafer, whereby this joint part breaks off to give rise to chipping.

As described above, the acute bends are formed in the joint parts between the flat portion as the orientation flatness and the contour of the wafer. In this regard, it has been found that a harmful phenomena occurs in the regions of the acute bends. In the processing of the wafer, when a photoresist film for a photolithographic process is formed on the surface of the wafer, crowns and fringes appear in the photoresist film. When a thin film such as an epitaxially vapor-grown layer is formed on the wafer surface, a film of abnormal thickness is formed due to, e.g., abnormal growth.

It is accordingly an object of the present invention to provide a wafer and a method of working the same which can prevent the appearance of foreign matter and the occurrence of other various defects attributed to the chipping of the joint regions between the contour of the wafer and the cut-away portion of the wafer such as an orientation flatness.

This invention can best be understood by reference to the following description taken in connection with the accompanying illustrative drawings.

DESCRIPTION OF THE PREFERRED EMBODIMENTS

Now, the present invention will be described in detail in connection with embodiments illustrated in the drawings.

Figure 1:
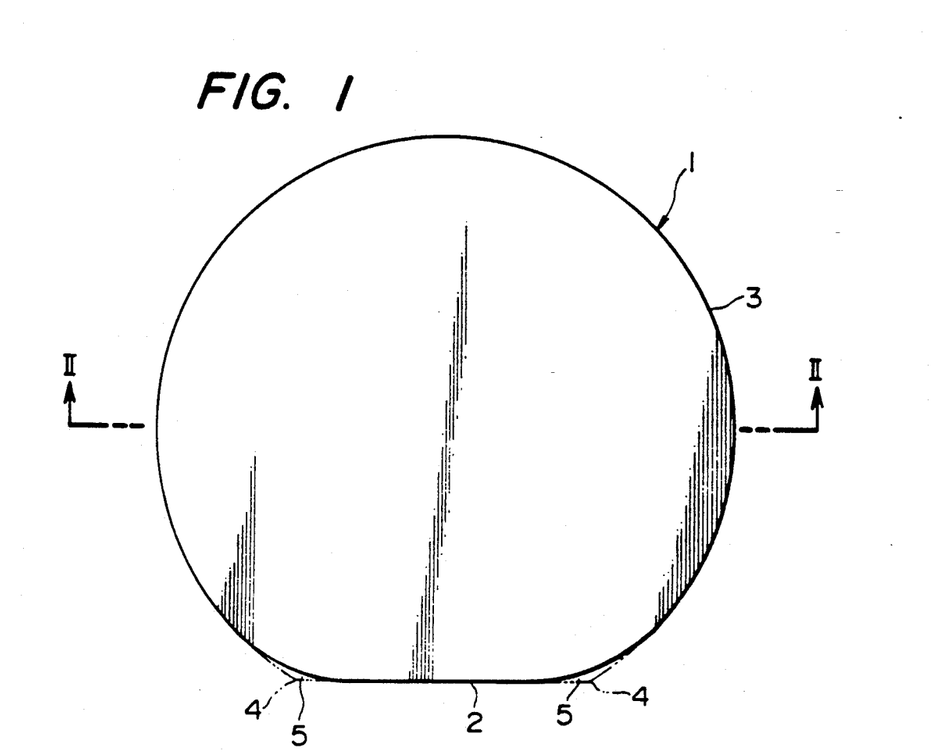
FIG. 1 is a plan view showing a semiconductor wafer which is an embodiment of the present invention.
Figure 2:
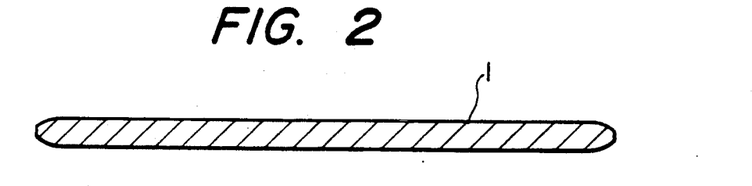
FIG. 2 is a sectional view taken along line II—II in FIG. 1.
Figure 3:
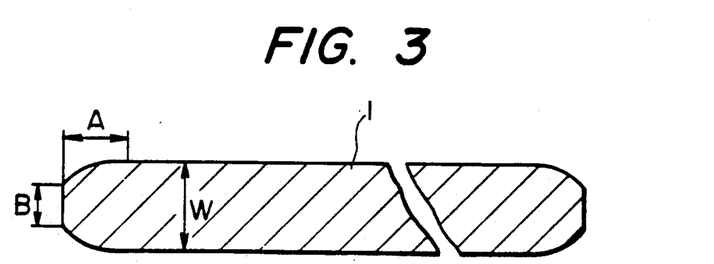
FIG. 3 is an enlarged view of FIG. 2.

Referring now to the drawings wherein like reference numerals are used throughout the various views to designate like parts and, more particularly, to FIGS. 1-3, according to these figures, a wafer 1 of this embodiment has a circular shape prepared by, for example, slicing an ingot of silicon (Si) whose sectional shape is substantially circular. In a part of the wafer 1, a principal flatness (flat) or orientation flatness or orientation flat (O. F.) 2 is formed to be rectilinear as a positioning removal portion for indicating the direction of a crystal axis and for positioning the wafer 1 in various processing. As shown most clearly in FIG. 3, an outer peripheral portion 3 of the wafer 1 is, for example, arcuately chamfered.

Further, according to the wafer 1 of this embodiment, in the joint parts 4 between both the ends of the orientation flatness 2 and the contour of the wafer 1, corner regions indicated by two-dot chain lines are chamfered into the shape of circular arcs indicated by solid lines. Due to such structure, the wafer 1 is so constructed that the corner regions of the joint parts 4 are prevented from chipping during the various processing of the wafer 1, the chipping causing defects such as the appearance of foreign matter in the form of broken chipping pieces.

More specifically, the chamfered region 5 of the joint part 4 in the embodiment of FIG. 1 is a region enclosed with the solid line and the two-dot chain line. The inner edge of the chamfered region 5 is defined by the circular arc of a common inscribed circle which is inscribed on the contour of the wafer 1 and the orientation flatness 2.

In case of performing the arcuate chamfering of the joint part 4, the preferable chamfer range of the chamfered region 5 is determined in a way to be described in detail below with reference to FIGS. 4 and 5.

The wafers 1 are usually positioned by rotating them while the peripheries of the wafers 1 are held in touch with a roller 6. Herein, the phenomenon is exploited in which, when the orientation flatness 2 of the wafer 1 has moved up to the roller 6, the wafer 1 stops rotating due to this orientation flatness being the flat portion.

When the circular periphery of the wafer 1 is in touch with the roller 6, the wafer 1 is rotated along with the rotation of the roller 6. With the orientation flatness 2, however, even when the wafer 1 and the roller 6 lie in touch, the turning effort of the roller 6 does not contribute to the rotation of the wafer 1. Thus, in spite of the rotation of the roller 6, the wafer 1 stops rotating and moving and holds its state.

Figure 4:
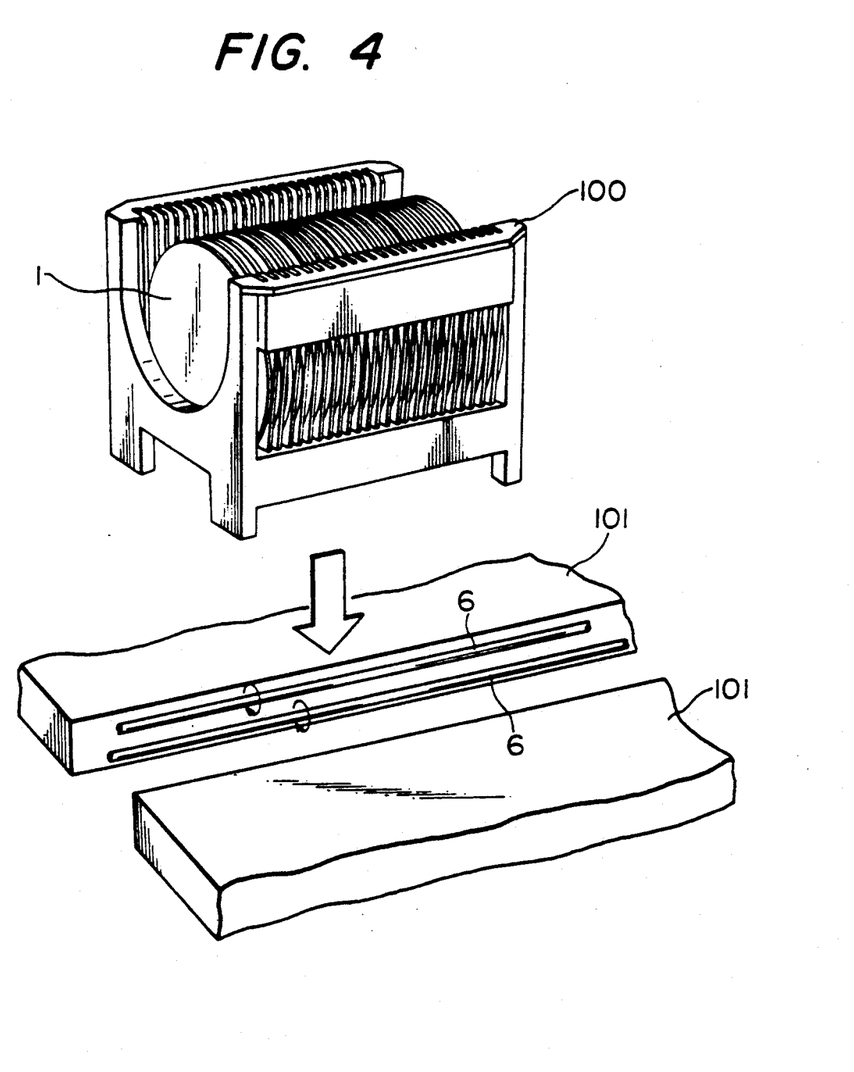
FIG. 4 is an explanatory view for illustrating the positioning of wafers.

As shown most clearly in FIG. 4, a wafer jig 100, receiving a large number of wafers 1, is placed on a positioning rest 101 which has two rollers 6. When the rollers 6 are subsequently rotated, the wafers 1 received in the wafer jig 100 start rotating. When the orientation flatness portions 2 of the respective wafers have moved up to the positions of the rollers 6, the wafers 1 do not rotate any longer and such a state is established for all the wafers 1. Eventually, all the wafers 1 are aligned in the state in which the orientation flatness portions 2 of the respective wafers 1 are located on the lower side.

In executing such positioning, regulation or alignment of the wafers 1, there are various methods other than the aforementioned one, such as, for example, a method employing a single roller 6 and a method resorting to optical means composed of photoelectric elements etc.

Figure 5:
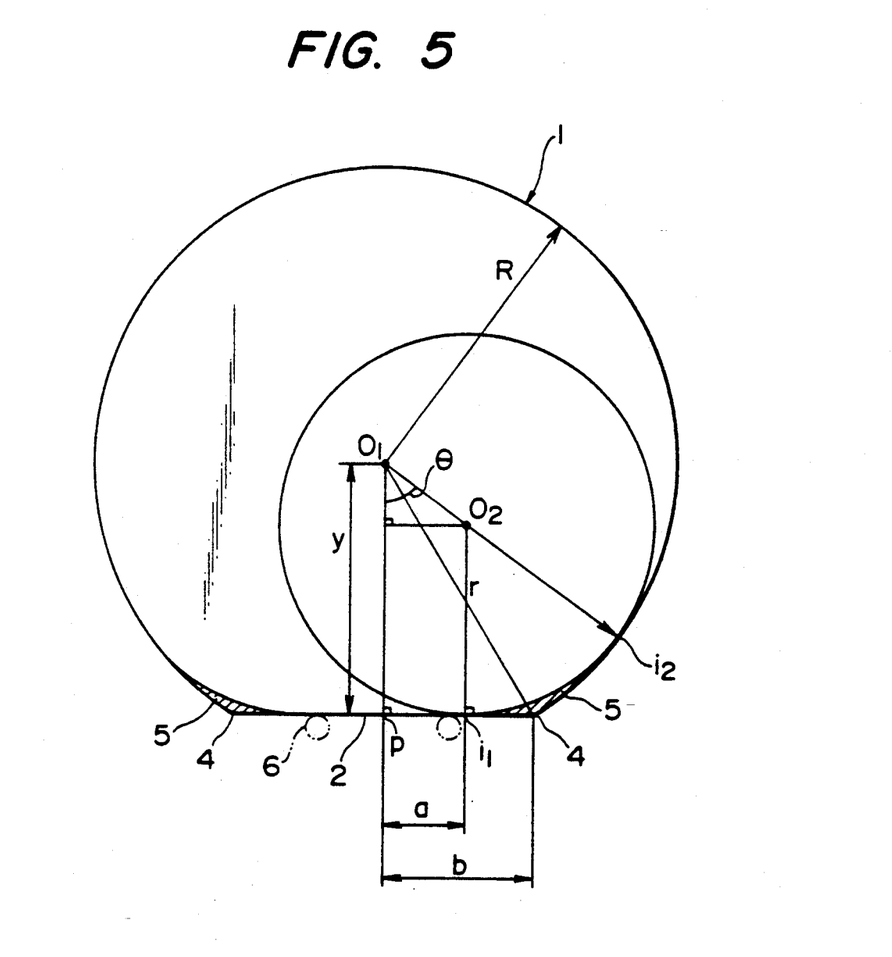
FIG. 5 is a plan view for explaining the determination of chamfer regions in the wafer shown in FIGS. 1 to 3.

Referring to FIG. 5, a wafer 1 having a width W has a radius R, and its center is $O_1$. The distance from the center $0_1$, to the orientation flatness 2 of the wafer is denoted by y.

When a perpendicular is drawn from the center $O_1$ down to the orientation flatness 2, the point of intersection P is supposed to be the middle point of the orientation flatness 2. The reference character b represents a distance between a point at the middle of the full length of the orientation flatness 2 before the chamfer, namely, the point P and a joint part 4 formed by the orientation flatness 2 and the contour of the wafer 1.

It is stipulated in SEMI standards that the relationship between the length of the orientation flatness 2 as well as the width W of the wafer 1 and the diameter D=2R of the wafer 1 becomes as indicated in Table 1 in the mirror wafer state.

Table 1

| | Diameter of Wafer | | | |
|---|---|---|---|---|
| | 3 inches | 100 mm | 125 mm | 150 mm |
| Allowable Range of Diameter [mm] | 75.56–76.84 | ±1 | ±1 | ±1 |
| Width [μm] | 360–410 | 500–550 | 600–650 | 650–700 |
| Length of Orientation Flatness | 19.05–25.40 | 30–35 | 40–45 | 55–60 |

On the other hand, since the wafers 1 need to be positioned by utilizing the orientation flatnesses 2, the orientation flatness 2 has that length of the flat portion which must be possessed, at the minimum, for accurate positioning. Letting a denote the half of such length, the length a is the distance from the point P to the point of inscription $i_1$ between a common inscribed circle and the orientation flatness 2. As noted above, photoelectric elements etc. other than the roller 6 may well be used as the positioning means.

Letting $i_2$ denote the point of inscription between the common inscribed circle and the contour of the wafer 1, the center $O_2$ of the common inscribed circle lies on a straight line which connects the center $O_1$ of the wafer 1 and the point inscription $i_2$. The angle between this straight line and the straight line $\overline{O_1P}$ is expressed by $\theta$.

Accordingly, the radius r of the common inscribed circle which is inscribed to both the contour of the wafer 1 and the orientation flatness 2 is obtained as stated below.

First, the minimum required length for the positioning by the rollers 6, namely, the length a ($a=\overline{Pi_1}$) of that flat portion in the orientation flatness 2 which is not chamfered is given by:

$$a = (R-r)\sin\theta \tag{1}$$

Secondly, the length y of the perpendicular $\overline{O_1P}$ drawn from the center $O_1$ of the wafer 1 to the orientation flatness 2 is given by:

$$y = (R-r)\cos\theta + r \tag{2}$$

From a right-angled triangle $O_1P4$, $y^2 = R^2 - b^2$ holds. Therefore, $$y = \sqrt{R^2 - b^2} \tag{3}$$

Substituting Equation (3) into Equation (2), $$\sqrt{R^2 - b^2} = (R-r)\cos\theta = r \tag{4}$$

$$\cos\theta = \frac{\sqrt{R^2 - b^2} - r}{(R-r)}$$

From Equation (1), $$\sin\theta = \frac{a}{(R-r)} \tag{5}$$

Since $\sin^2\theta + \cos^2\theta = 1$, Equations (4) and (5) yield:

$$\frac{a^2}{(R-r)^2} + \frac{(\sqrt{R^2-b^2} - r)^2}{(R-r)^2} = 1 \tag{6}$$

Putting Equation (6) in order.

$$r = \frac{b^2 - a^2}{2(R - \sqrt{R^2 - b^2})} \tag{7}$$

Accordingly, in the present embodiment, the chamfer region 5 in the joint region 4 between the contour the wafer 1 and the orientation flatness 2 may be worked along the circular arc of any radius as long as this circular arc is the arc of the common inscribed circle radius r in Equation (7) or falls within a region outside it, as indicated by oblique lines in FIG. 5.

That is, the radius r of the inscribed circle common to both the contour line of the wafer 1 and the orientation flatness 2 may lie within a range given by the following expression, and the joint part 4 may be arcuately chamfered within this range of radius r:

$$r \leq \frac{b^2 - a^2}{2(R - \sqrt{R^2 - b^2})} \tag{8}$$

On the other hand, the minimum value of the radius r in the chamfering can be set as stated below.

As shown in FIG. 3, the silicon wafer 1 according to the present invention has the peripheral parts of both its major surfaces chamfered. The dimensions of the chamfering, namely, the length A of a slant face portion and the length B an end face portion are manipulated from experimental values. It was experimentally determined that the length B of the chamfer end face portion differs depending upon the width of the wafer 1. It has been experimentally found that when the length B of is at most 0.32 mm (320 μm) and at least 0.15 mm (150 μm) for W of 0.4 mm, the chipping of the peripheral part the wafer exhibits the minimum value. It has also been found that the chipping of the peripheral part the wafer exhibits the minimum value when 150 μm$\leq$B$\leq$420 μm for W=0.5 mm and when 150 μm$\leq$B$\leq$520 μm for W=0.6 mm. That is, the chipping of the peripheral part of the wafer is minimized when the length B of the chamfer end face portion in the wafer periphery is at least 150 μm and, at most, a value obtained by subtracting 80 μm from the wafer width W. In other words, the chipping falls within the range of 150 μm$\leq$B and B$\leq$(W−80) μm. Thus, in the chamfer dimensions of the silicon wafer 1 according to the present invention, the length B of the end face portion is set by the following expression, whereby the breakage and chipping of the wafer 1 attributed to mechanical shocks etc. during the processing or transportation of the wafer extraordinarily decreases:

$$150 \mu \leq B \leq (W-80) \mu m \tag{9}$$

On the other hand, the length A of the slant face portion in the chamfer dimensions of the silicon wafer 1 according to the present invention is experimentally set to be at least 0.2 mm (200 μm), whereby the breakage and chipping of the wafer 1 attributed to mechanical shocks etc. during the processing or transportation of the wafer can be extraordinarily reduced.

In view the above and as shown in FIG. 3, the peripheral parts both the major surfaces of the semiconductor wafer may be chamfered. Herein, the chamfering dimensions as to the sectional shape of the wafer may be such that the length B of the chamfer end face portion is set at a value within the range not smaller than 150 μm and not greater than the value obtained by subtracting 80 μm from the width the wafer, while the length A of the chamfer slant face portion is rendered at least 200 μm.

Accordingly, the radius r of the inscribed circle common to both the contour of the wafer 1 and the orientation flatness 2 may fall within a range given by the following expression, and the joint part may be chamfered arcuately within this range of radius r:

$$\frac{W - B}{2} \leq r \tag{10}$$

From Expressions (8) and (10), the chamfering radius r may lie within a range given by the following expression:

$$\frac{W - B}{2} \leq r \leq \frac{b^2 - a^2}{2(R - \sqrt{R^2 - b^2})} \tag{11}$$

where
r = radius of the wafer chamfering circle,
R = radius of the wafer,
a = half of the length of the unchamfered portion (flat portion) in the wafer cut-away portion,
b = half the full length of the wafer cut-away portion before being chamfered,
W = width of the wafer, and
B = length of the wafer end face portion.

In this manner, the wafer 1 according to the present invention is chamfered in the peripheral parts of the sliced silicon wafer with the predetermined dimensions and is thus smoothed so as not to protrude the corners so that a breaking off or chipping of the wafer is prevented. Moreover, even when there is an impact on the wafer 1, there is no local concentration of a load, therefore the strength of the peripheral part of the wafer increases, and the quantity of the chipping of the peripheral part can be reduced. Accordingly, it is possible to avoid the problem of silicon chips floating in the air as dust and the adhering of the chips to the surface of the silicon wafer; therefore, in the wafer processing for producing a semiconductor device a photoresist film in a photolithographic process can the external appearance its surface enhanced and a lowering of its resolution prevented, and favorable vapor growth etc. free from any abnormal epitaxial growth can be effected. Further, since the chamfering dimensions are adapted to relieve the crowns and fringes of the photoresist and to enhance the resolution thereof, various patterns can be formed on the wafer by fine working.

According to the present invention, no acute corner or bend exists in the joint region between the contour the wafer 1 and the orientation flatness 2. Therefore, it is possible to prevent a break off in the joint region and development of chipping due to, for example, the collision against the guide of an air bearing or contact with another wafer during the transportation the wafer 1. In addition to the defect of the foreign matter due to the appearance of chip pieces, it is also possible to significantly reduce defects such as, for example, inferior transportation due to acute corner hitches on the guide of the air bearing, etc., and an inferior thickness of a resist film attributed to a partial dispensing of resist film due to the turbulence of an air current in the acute corner during the application of the resist. This is especially favorable for wafers of large diameter.

Figure 6:
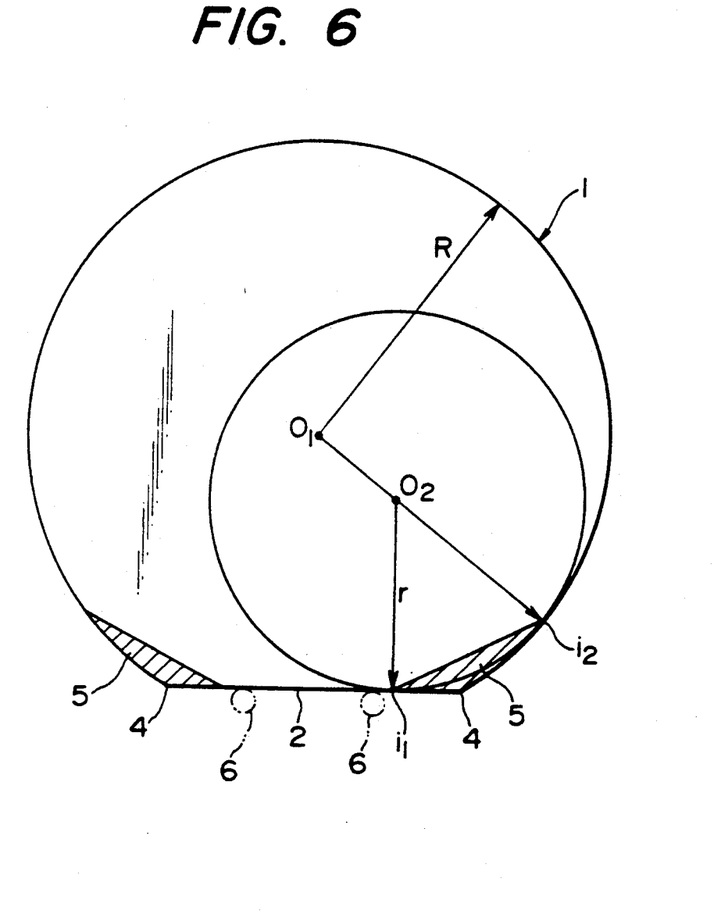
FIG. 6 is a plan view of another embodiment of the wafer according to the present invention.

As shown in FIG. 6, the joint parts 4 between the contour a wafer 1 and an orientation flatness 2 are rectilinearly chamfered within the ranges of chamfer regions 5 indicated by oblique lines. The maximum chamfer range of the chamfer region 5 is defined by a straight line which connects the points of inscription $i_1$ and $i_2$ of an inscribed circle common to both the contour of the wafer 1 and the orientation flatness 2, as explained before with reference to FIG. 5. The radius r of the common inscribed circle can be selected within the same range as indicated by expression (11).

Also in FIG. 6, there is no acute corner or bend in the joint part 4 between the contour of the wafer 1 and the orientation flatness 2, so that the defect of the foreign matter due to the appearance of chipping pieces, the defect of the transportation, the defect of the thickness of a resist film, etc. can be sharply reduced.

The chamfering according to the present invention may be in any shapes other than the arcuate and rectilinear shapes in the foregoing embodiments, such as various curved shapes and polygonal shapes insofar as the shapes can remove acute corners.

Figure 7:
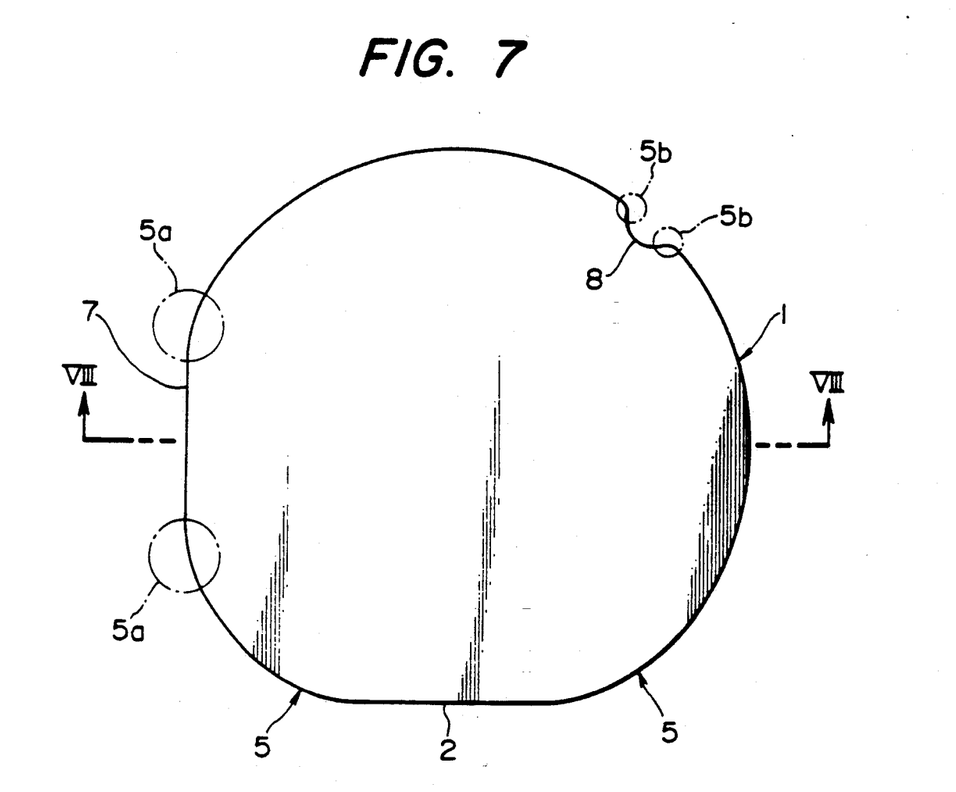
FIG. 7 is a plan view showing still another embodiment of the present invention.
Figure 8:
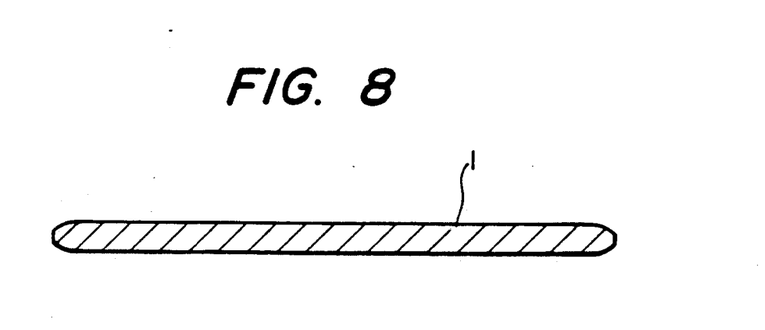
FIG. 8 is a sectional view taken along line VIII—VIII in FIG. 7.
Figure 9:
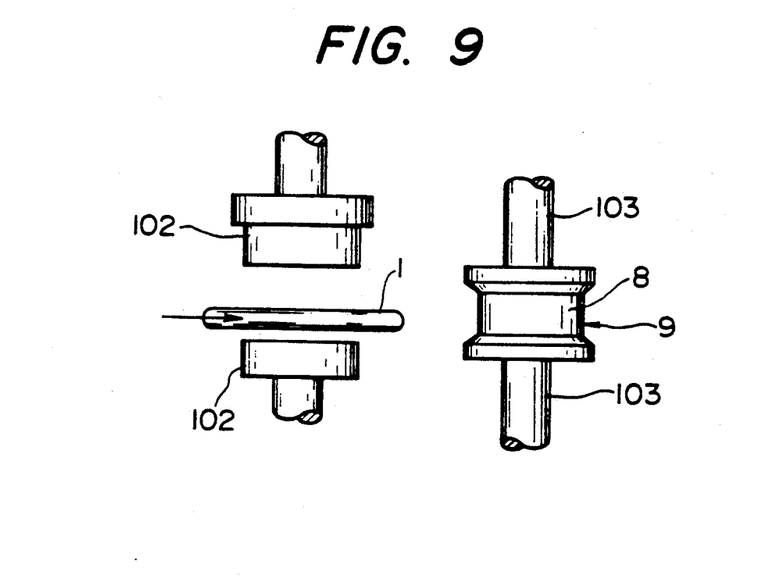
FIGS. 9 to 17 are schematic views showing three examples of chamfering devices which can be used for performing a method of working a wafer according to the present invention.
Figure 10:
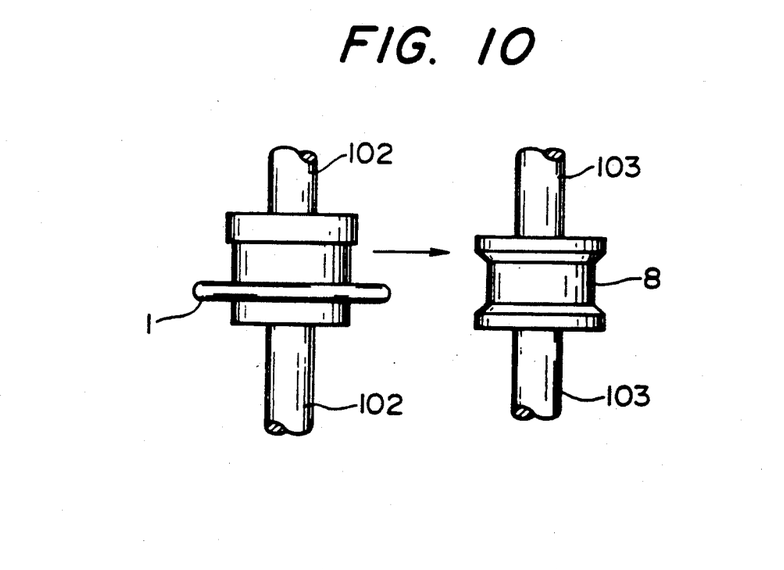
Figure 11:
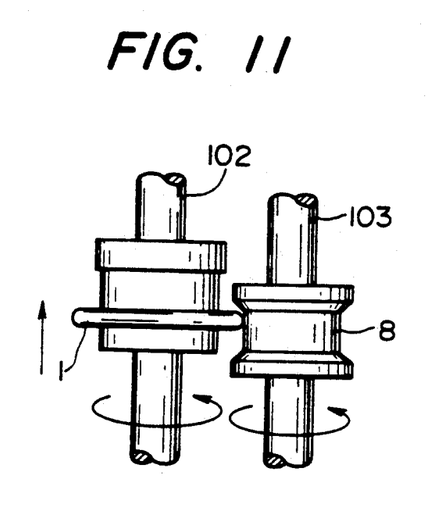
Figure 12:
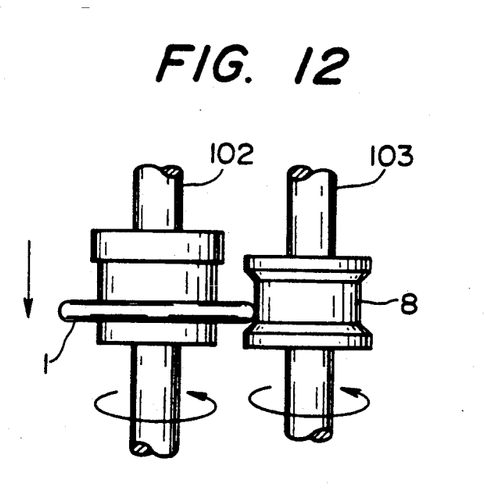
Figure 13:
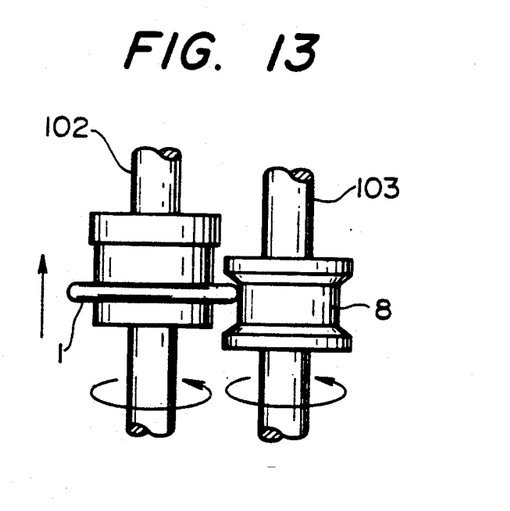

The present invention is applicable, not only to providing the principal flatness or the orientation flatness, but also to providing a sub flatness or a second flatness. More particularly as illustrated in FIGS. 7 and 8, the chamfer regions 5 of the joint regions between both the ends the orientation flatness 2 and the contour of the wafer 1 are chamfered, and, as in ranges indicated by symbol 5a, also the joint regions between both the ends of the second flatness 7 and the contour of the wafer 1 are chamfered along the arcs of common inscribed circles inscribed to both the second flatness 7 and the contour of the wafer 1 or along straight lines connecting the points of inscription of the common inscribed circles, or in the regions outside them.

Further, the present invention is applicable to a case where, besides the flat portions such as the orientation flatness 2 and the second flatness 7, a curved positioning notch 8 is formed in the wafer 1. In this case, the joint regions between both the ends of the positioning notch 8 and the contour of the wafer 1 may be chamfered along the arcs of common inscribed circles inscribed to both the positioning notch 8 and the contour of the wafer 1 or along straight lines connecting the points of inscription of the common inscribed circles, or in the regions outside them, as in ranges indicated by symbol 5b.

The chamfering of the present invention may well be performed simultaneously with the formation of the orientation flatness 2, or with the chamfering of the outer peripheral part 3 in the thickness direction. Such simultaneous chamfering is very favorable in point of the job efficiency, but separate chamfering may well be performed. Of course, the present invention does not always require the chamfering of the outer peripheral part 3 of the wafer 1 in the thickness direction.

Examples of chamfering devices for carrying out the necessary chamfering in the wafers described above are illustrated in FIGS. 9 to 13. The devices are so-called shape profiling type devices. While a grindstone 81 having a rectilinear groove 9 is rotated, it is moved in the horizontal direction and the vertical direction to perform a chamfering operation. The grindstone 81 can also perform a chamfering of the outer peripheral part of the wafer 1 in the thickness or width direction. The chamfering device also includes a chuck mechanism 102 for the wafer 1, and a chuck mechanism 103 for the grindstone 81 which are respectively adapted to rotate and move vertically and horizontally.

Figure 14:
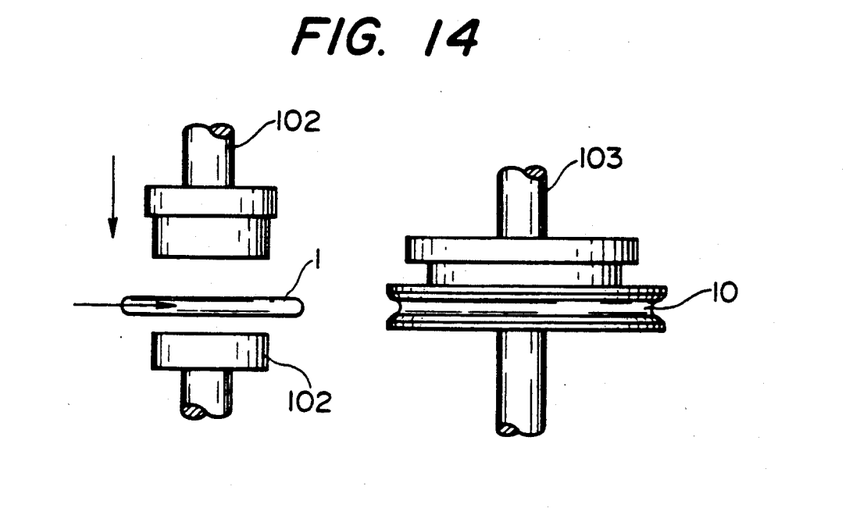
Figure 15:
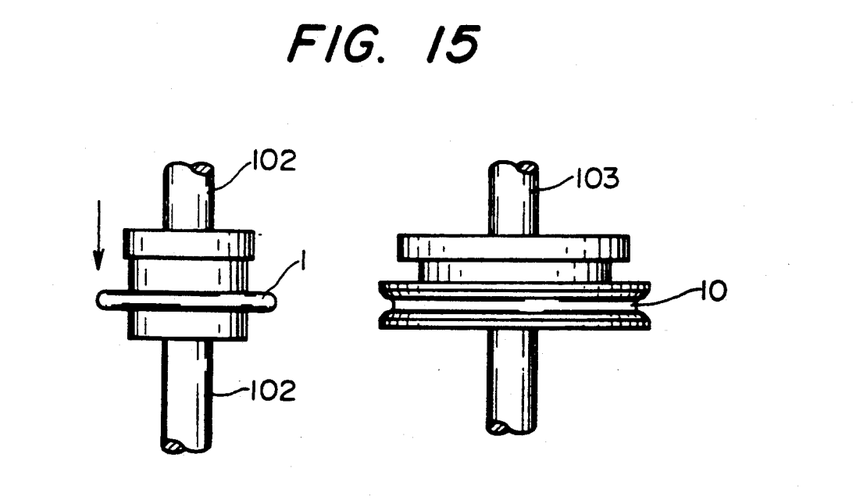
Figure 16:
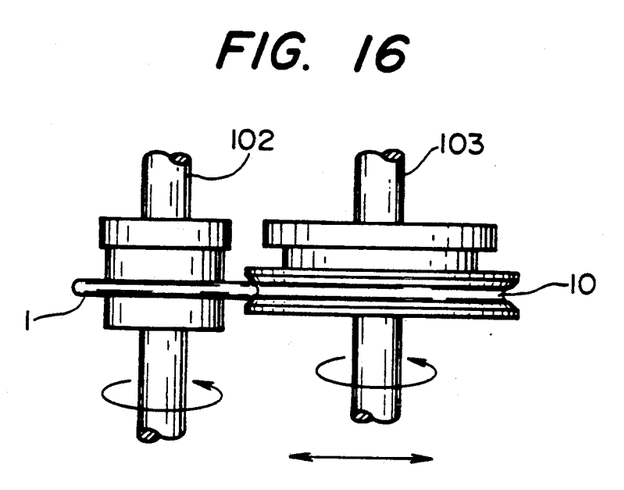

FIGS. 14 to 16 provide an example of a so-called shape transfer type chamfering device. While being rotated, a grindstone having a curved groove 11 which is conformed to the shape of the chamfering of the outer peripheral part of the wafer 1, in the thickness direction, is moved in the horizontal direction. Thus, the outer peripheral part of the wafer 1 can be chamfered as shown in FIGS. 1 to 3. Additionally, the chamfer regions 5, 5a and 5b shown in FIGS. 5 to 8 can be chamfered.

In this manner, the chamfering devices in FIGS. 9 to 16 can perform both the chamfering of the chamfer regions 5, 5a, 5b and that of the outer peripheral part of the wafer 1. Therefore, these mechanical chamfering operations can be efficiently performed at the same time, though they may well be executed individually.

Figure 17:
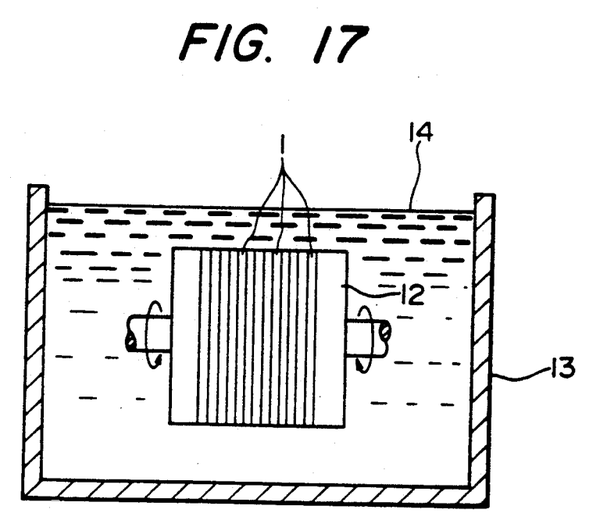

FIG. 17 provides an example of a chemical chamfering device wherein a rotary supporter 12 in which a large number of wafers 1 are sandwiched, is immersed in a liquid etchant 14 (for example, a solution having a composition which consists of fluoric acid, nitric acid and glacial acetic acid at a volumetric ratio of 2:5:3) contained in an etching bath 13. While being rotated along with the rotary supporter 12, the wafers 1 have their outer peripheral parts etched by the liquid etchant 14. In this case, in order to chamfer only the chamfer regions 5, 5a and 5b, the other outer peripheral parts the wafers 1 need to be masked so as not to touch the liquid etchant 14. However, the corners of the whole outer peripheries may well be chemically chamfered in the thickness direction by the liquid etchant after the chamfer regions 5, 5a and 5b have been formed by mechanical grinding in advance. In the case of FIG. 17, mechanical shocks on the wafers 1 can be relieved.

The present invention is not restricted to the wafers made silicon (Si), but is also applicable to wafers made of germanium (Ge) or various compound semiconductor materials such as gallium arsenic (GaAs) and gallium garnet.

As set forth above, according to the present invention, no acute corner or bend exists in the joint regions between the contour of the wafer and the cut-away portion of the wafer such as a removed portion for positioning. It is therefore possible to remarkably reduce defects ascribable to the existence of acute corners or bends, such as the defect of a foreign matter due to the chipping the wafer, the defect of transportation and the defect of the thickness of a resist film.

What is claimed is:

1. A wafer for forming an integrated circuit thereon, the wafer comprising:
   a main surface on which an integrated circuit is to be formed;
   a substantially circular contour portion surrounding said main surface;
   a curved notch formed in said circular contour portion; and
   connecting portions defined between said circular contour portion and said curved notch, wherein said connecting portions are chamfered in a plane parallel to said main surface.

2. A wafer according to claim 1, wherein the chamfer of each of said connecting portions lies within the range defined by the points of an inscribed circle common to both the circular contour portion and the curved notch, and a radius of each inscribed circle is determined by the following expression:

$$\frac{W-B}{2} \leqq r \leqq \frac{b^2 - a^2}{2(R - \sqrt{R^2 - b^2})}$$

where
- r = radius of the inscribed circle,
- R = radius of the wafer,
- a = half of a length of an unchamfered portion in a positioning removal portion,
- b = half of a full length of the positioning removal portion before the chamfering,
- W = width of the wafer, and
- B = length of wafer end face portion.

3. A wafer according to claim 1, wherein at least one of said connecting portions is rectilinearly chamfered in a plane parallel to said main surface.

* * * * *